United States Patent [19]

Hernandez

[11] Patent Number: 4,994,936

[45] Date of Patent: Feb. 19, 1991

[54] MOLDED INTEGRATED CIRCUIT PACKAGE INCORPORATING DECOUPLING CAPACITOR

[75] Inventor: Jorge M. Hernandez, Mesa, Ariz.

[73] Assignee: Rogers Corporation, Rogers, Conn.

[21] Appl. No.: 479,075

[22] Filed: Feb. 12, 1990

[51] Int. Cl.$^5$ .................... H01G 1/14; H05K 7/02; H01L 23/02

[52] U.S. Cl. ...................... 361/306; 357/74; 361/386

[58] Field of Search ............ 361/306, 321, 386; 29/25.42; 357/74; 174/72, 52 FP

[56] References Cited

U.S. PATENT DOCUMENTS

4,288,841 9/1981 Gogal ............................ 357/74 X
4,734,819 3/1988 Hernandez et al. ............ 361/306
4,750,092 6/1988 Werther ......................... 361/386 X Primary Examiner—Donald A. Griffin
Attorney, Agent, or Firm—Fishman, Dionne & Cantor

[57] ABSTRACT

A decoupling capacitor is attached directly to an IC lead frame and thereafter encapsulated within a molded package along with an IC chip resulting in a decoupling scheme which is internal to the molded IC package. The capacitor preferably comprises a thin layer of ceramic dielectric sandwiched between top and bottom conductors. The top conductor may be attached to the die bar of the lead frame using an electrically non-conductive or conductive adhesive. Leads extending from the capacitors are attached to appropriate fingers of the lead frame by welding, soldering or the like to effect strong mechanical and electrical contact.

22 Claims, 8 Drawing Sheets

MOLDED INTEGRATED CIRCUIT PACKAGE INCORPORATING DECOUPLING CAPACITOR

BACKGROUND OF THE INVENTION

This invention relates to the field of integrated circuits packaged in a molded housing. More particularly, this invention relates to a method of suppressing noise (e.g. decoupling) from the voltage to ground distribution circuit in integrated circuit packages such as surface mounted leaded or leadless chip carriers, dual-in-line packages, and quad flat packages.

This application is related to U.S. application Ser. No. 479,091 entitled MOLDED INTEGRATED CIRCUIT PACKAGE INCORPORATING THIN DECOUPLING CAPACITOR invented by Jorge Hernandez and U.S. application Ser. No. 479,073 entitled MOLDED INTEGRATED CIRCUIT PACKAGE INCORPORATING HEAT SINK invented by Jorge Hernandez and Scott Simpson, both of which have been filed contemporaneously with this application.

It is well known in the field of microelectronics that high frequency operation, particularly the switching of integrated circuits, can result in transient energy being coupled into the power supply circuit. It is also well known that integrated circuits are becoming more dense (more gates per unit area of silicon/or gallium arsenide), more powerful (more watts per unit area of IC chip), and faster with higher clock rate frequencies and with smaller rise times. All of these recent and continued developments make the problem of suppressing noise in the power bus (produced by a large amount of simultaneous gates switching) even more serious than in the past.

Generally, the prevention of the coupling of undesired high frequency noise or interference into the power supply for an integrated circuit is accomplished by connecting a decoupling capacitor between the power and the ground leads of the IC. Conventional methods of decoupling (noise suppression) include the use of decoupling capacitors external to the IC package, such as monolithic multilayer ceramic chip capacitors. One external connection scheme of this type which has been found to be quite successful is to mount a decoupling capacitor underneath an integrated circuit. Such decoupling capacitors are commercially available from Rogers Corporation (assignee of the present application) and are sold under the trademark MICRO Q. Examples of these decoupling capacitors are found in U.S. Pat. Nos. 4,475,143, 4,502,101 and 4,748,537, all of which are assigned to the assignee hereof. U.S. Pat. Nos. 4,626,958, 4,667,267, 4,658,327, 4,734,818, 4,734,819 and 4,853,826 are also assigned to the assignee hereof. These patents disclose decoupling capacitors which are particularly well suited for pin grid array and plastic leaded chip carrier packages.

Still other decoupling connection schemes are known. For example, multilayer capacitor (MLC) chips have been placed on top of PGA ceramic IC Packages with interconnections built-in from the surface of the PGA package down to the proper places in internal circuitry of the package. In still some other cases, schemes have been devised to incorporate a MLC chip into a specially configured IC lead frame, but due to production difficulties, this approach has not become widely accepted. Attempts have also been made to build a capacitive layer into a PGA ceramic package (and into a leadless ceramic chip carrier), by using thin layers of alumina or other adequate ceramic dielectric material. Again, this approach has not found wide acceptance.

For a number of years, the users of integrated circuits have been aware of the need to reduce the inductance of the decoupling loop, so that switching noise can be minimized. The best way to accomplish this is by placing the decoupling capacitor as close to the IC chip (silicon or gallium arsenide) as possible. Ideally, the decoupling capacitor should be built in with the IC itself. However, due to materials and processing incompatibilities, this is not possible at the present time.

Accordingly, there continues to be a need for improved connection schemes for decoupling undesired high frequency noise from integrated circuits wherein the inductance within the decoupling loop is reduced to as low a level as possible.

SUMMARY OF THE INVENTION

The above-discussed and other problems and deficiencies of the prior art are overcome or alleviated by the decoupling scheme of the present invention which is particularly well suited for use with molded integrated circuit packages incorporating lead frames. In accordance with the present invention, a flat decoupling capacitor is attached directly to the IC lead frame and thereafter encapsulated within the molded package along with the IC chip resulting in a decoupling scheme which is internal to the molded IC package. The capacitor is of the parallel plate type and preferably comprises a thin layer of ceramic dielectric sandwiched between top and bottom conductors. The top conductor may be attached to the die bar of the lead frame using an electrically conductive or non-conductive adhesive. Leads extending from the capacitors are attached to appropriate fingers of the lead frame by welding, soldering or the like to effect strong mechanical and electrical contact.

The decoupling scheme of the present invention provides many features and advantages relative to prior art decoupling schemes. For example, the close proximity between the decoupling capacitor and IC chip provides noise decoupling with very low inductance. Also, the decoupling capacitor may be attached to the lead frame without interfering with existing automatic IC assembly processes such as die attachment, wire bonding and encapsulation by transfer molding.

Still another important feature of this invention is an improvement in heat transfer from the IC chip out of the molded package. Presently, heat is conducted out of the package primarily through the molding compound from the silicon chip. By attaching the decoupling capacitor to the lead frame, an improvement in heat conduction results in that the capacitor acts as a heat spreader by dispersing heat from the IC chip to the molding compound through a larger cross-section. This feature becomes more prominent when the area of the decoupling capacitor conductors is larger than that of the IC die support platform. Also, because of the space taken up by the capacitor, any heat will have less plastic package to pass through in order to exit the package. In a preferred embodiment, additional improvement in heat transfer is achieved by use of a heat sink plug.

The above discussed and other features and advantages of the present invention will be appreciated and understood by those of ordinary skill in the art from the following detailed description and drawings.

BRIEF DESCRIPTION OF THE DRAWINGS

Referring now to the drawings wherein like elements are numbered alike in the several FIGURES.

DESCRIPTION OF THE PREFERRED EMBODIMENT

In accordance with the present invention, a decoupling capacitor is electrically connected to an integrated circuit chip internally within a molded IC package. This electrical connection is accomplished by attaching a decoupling capacitor to the lead frame of the IC package and then making appropriate connections between the decoupling capacitor and the fingers of the lead frame. The present invention is well suited for use with any type of molded IC package including, but not limited to plastic leaded or leadless chip carriers, dual-in-line packages, or quad flat packs. For purposes of illustration only, the following description of the present invention will be with regard to a lead frame for use in a plastic leaded chip carrier (PLCC) package. However, as already mentioned, the present invention is equally useful for any other type of molded package which utilizes lead frames.

Figure 1:
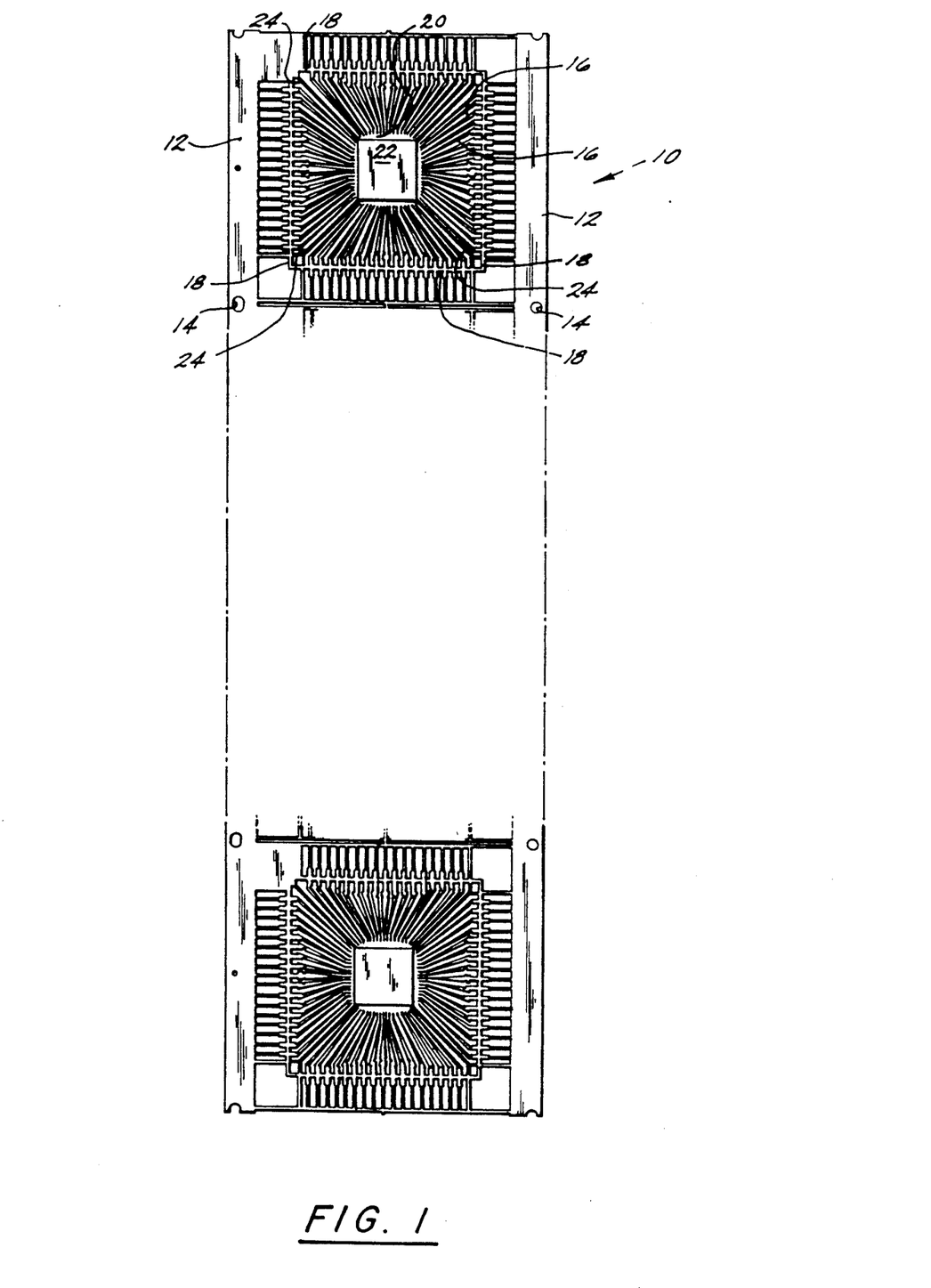
FIG. 1 is a plan view of a known lead frame in accordance with the prior art.

Turning now to FIG. 1, a lead frame strip is shown generally at 10. Such lead frame strips are well known in the art and comprise a plurality of adjacent lead frames interconnected between a pair of carrier supports 12 which incorporate registration holes 14. Each lead frame is made from thin stamped metal and includes a plurality of leads or fingers 16 which are supported on one end by a dam bar 18 and are unsupported on their opposite ends. All of the fingers 16 terminate at a space 20 which has a generally square shape. Within space 20 is a die support platform 22 which is supported on its four corners by four die bars 24 which in turn are connected to dam bars 18.

As is well known in the art, during production of IC packages, an integrated circuit chip or die is positioned on the die support platform 22. Next, the IC chip is electrically connected to each individual finger 16 by use of die wire bonding in a well known fashion. Thereafter, the IC chip and lead frame are encapsulated in a molded package with the ends of the fingers 16 adjacent the dam bar 18 being excised prior to the dam bar to provide a discrete integrated circuit chip package. It will be appreciated that no electrical circuitry (wire bonding) is connected between the integrated circuit chip and the die bars 24 so that the die bars are electrically inactive.

Figure 2:
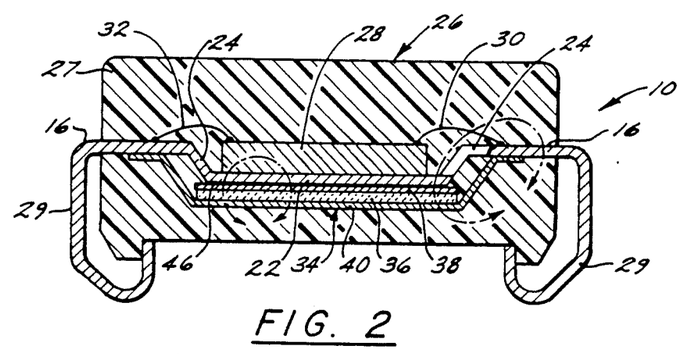
FIG. 2 is a cross sectional elevation view through a molded integrated circuit chip package.

Turning now to FIG. 2, a molded integrated circuit chip carrier package in accordance with the present invention is shown generally at 26. Package 26 includes a lead frame 10 wherein the die support platform 22 supports an integrated circuit chip 28 which has been wire bonded via wire bonds 30 and 32 to the fingers 16 of lead frame 10. The lead frame 10 and IC chip 28 have been encapsulated in a molded package 27. The ends of each finger 16 adjacent the dam bar have been excised and the leads bent so as to form J-leads 29. Of course, any other lead configuration may be used in accordance with this invention.

Figure 3:
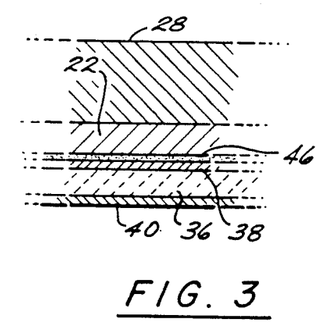
FIG. 3 is an enlarged view of a portion of FIG. 2.
Figure 4:
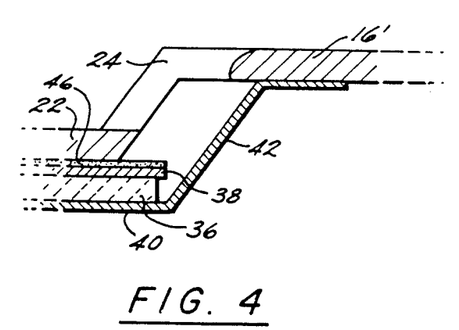
FIG. 4 is an enlarged view of a portion of FIG. 2.
Figure 5:
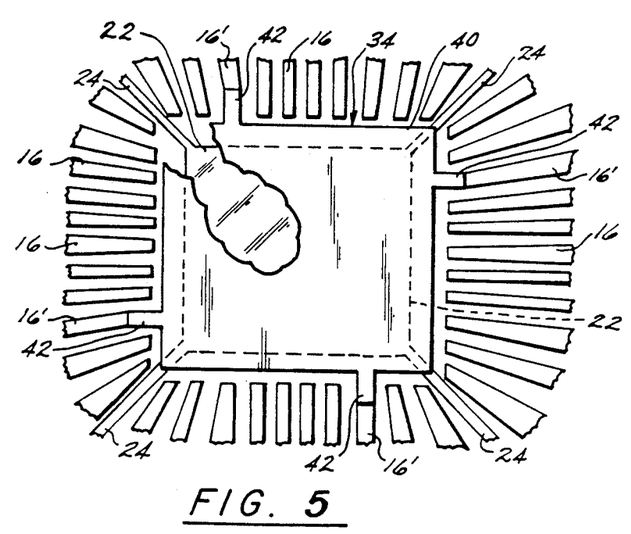
FIG. 5 is a bottom view of the lead frame/decoupling capacitor/integrated circuit chip configuration of FIG. 2 without the molding being present.
Figure 6:
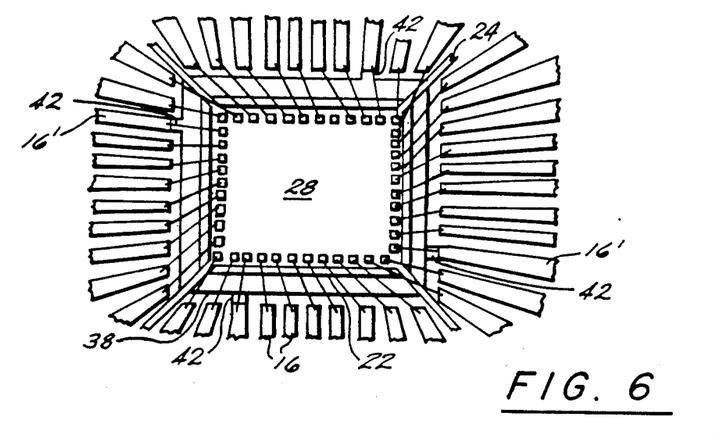
FIG. 6 is a top plan view of the assembly shown in FIG. 5.

In accordance with the present invention, a thin decoupling capacitor 34 is attached to the bottom surface of die support platform 22 which is opposite the surface thereof supporting integrated circuit chip 28. As shown in FIGS. 3I4 6, decoupling capacitor 34 preferably comprises a thin layer of dielectric material 36 which is preferably a ceramic. Dielectric layer 36 is sandwiched between an upper conductor 38 and a lower conductor 40. It will be appreciated that FIG. 5 is a view from below the lead frame/decoupling capacitor assembly looking upwardly (without the presence of molding 27) while FIG. 6 is a view from above the structure looking downwardly towards the IC chip 28 (similarly without the presence of molding 27). In the embodiment of FIGS. 2–6, only lower conductor 40 includes a plurality of leads 42 extending therefrom and bonded to selected ones of the lead frame finger 16. Thus, as shown in FIG. 5, bottom conductor 40 includes (for example only) four leads 42 which are connected to selected power and ground fingers 16' of lead frame 10. For reasons discussed immediately below, upper conductor 38 does not include any leads extending therefrom. Decoupling capacitor 34 is attached to die support platform 22 using a suitable electrically conductive adhesive 46 such as silver filled epoxy, polyimide or glass.

In a preferred embodiment, this adhesive will also exhibit good thermal conductivity so as to provide both good electrical contact between the electrode 38 in contact with the die support platform 22 as well as for enhancing heat dissipation of the IC silicon or other substrate through the die bar, lead frame fingers and through the decoupling capacitor itself. In the particular embodiment of the present invention shown in FIGS. 2-6, the IC chip 28 and die bar or die support platform 22 are electrically at ground potential thereby requiring an electrically conductive adhesive 46. As a result, conductor 38 does not necessitate leads for connection to selected fingers 16 of the lead frame. Connections to the lead frame/decoupling capacitor ground electrode 38 are achieved by the wire bonds from the IC to the ground fingers of the lead frame. As will be discussed hereinafter with regard to FIGS. 7-9, in the event that the die support platform 22 is not at ground potential, then adhesive 46 will be non-electrically conductive thereby insulating decoupling capacitor 34 from the die support platform 22 and conductor 38 will have leads which will be attached to the corresponding voltage or ground leads of the lead frame.

The surface area of capacitor 34 may be equal to, less than, or greater than the surface area of die platform 22. Preferably, however, capacitor 34 will have a larger surface area (as shown in FIGS. 5 and 6) which extends beyond the die support platform. This larger surface area of the capacitor 34 will act to both minimize inductance in the leads from the lead frame as well as to increase the capacitor's heat sink capabilities. It will be appreciated that the size of the capacitor is only limited by the distance between the dam bars 18 of the lead frame (see FIG. 1). Preferably, the length of the decoupling capacitor leads 42 should be as small as possible so as to minimize the capacitor inductance.

Figure 7:
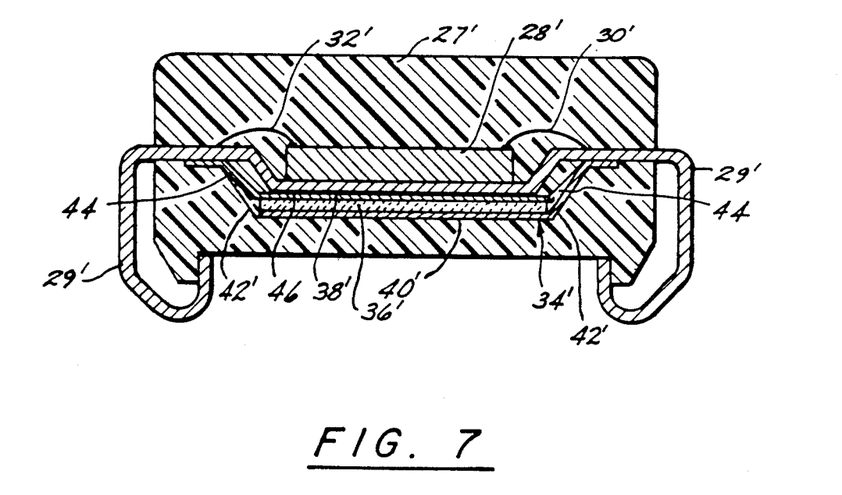
FIG. 7 is a cross sectional elevation view through a second embodiment of a molded integrated circuit package incorporating a decoupling capacitor in accordance with the present invention.
Figure 8:
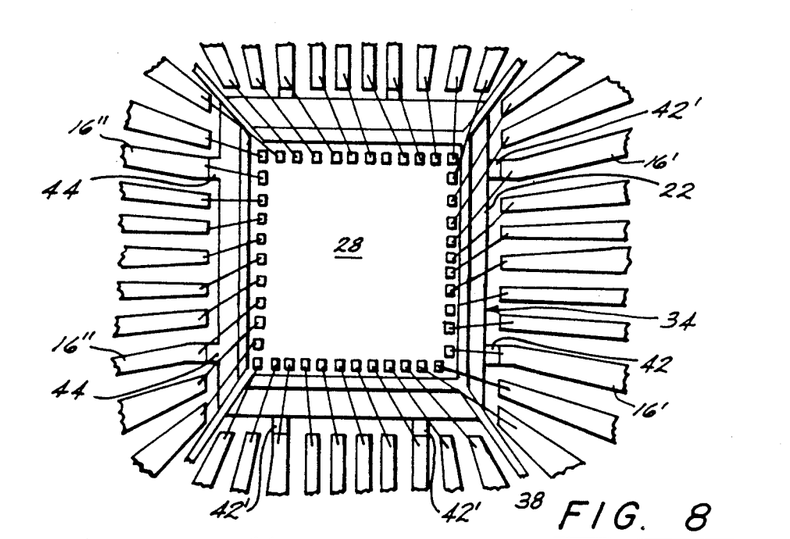
FIG. 8 is a top plan view of the assembly of FIG. 7 without the molding being present.
Figure 9:
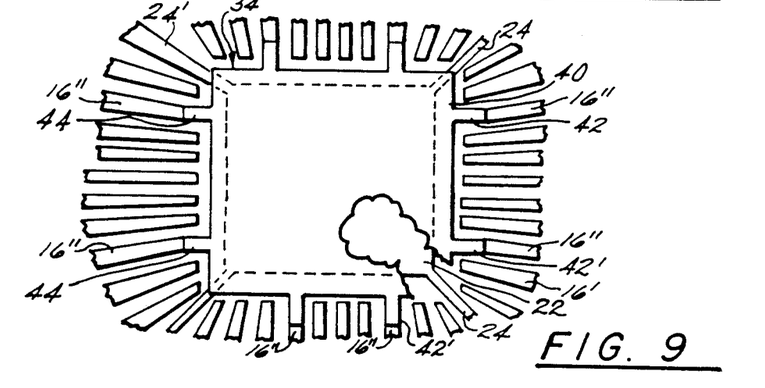
FIG. 9 is a bottom plan view of the assembly shown in FIG. 8.

Turning now to FIGS. 7-9, an embodiment of the present invention is shown wherein the decoupling capacitor is positioned under die bar platform 22' in the case where the integrated circuit chip 28' is not connected to ground. As mentioned, in this embodiment, adhesive 46' would be electrically non-conductive so that the decoupling capacitor is electrically isolated from IC chip 28'. Also, whereas the top conductor 38 in the FIG. 2-6 embodiment had no leads extending therefrom, in the FIG. 7-9 embodiment, top conductor 38' includes a plurality of leads 44 for attachment to selected power and ground fingers 16" of lead frame 10 as best shown in FIGS. 8 and 9.

In both of the embodiments shown in FIG. 2 and FIG. 7, the decoupling capacitor is preferably initially attached to the lead frame 10 prior to any die attachment or wire bonding operations. This is an important feature of the present invention as it allows the incorporation of a decoupling capacitor within a molded IC package without altering the presently used highly automated assembly process. Thus, the present invention can be utilized on existing assembly operations.

It will be appreciated that as an alternative to the parallel-plate capacitor 34, the present invention may also utilize a flat, thin multilayer capacitor such as the capacitors shown in FIGS. 3, 4, 9 and 10 of U.S. Pat. No. 4,748,537, the entire contents of which is fully incorporated herein by reference.

Figure 11:
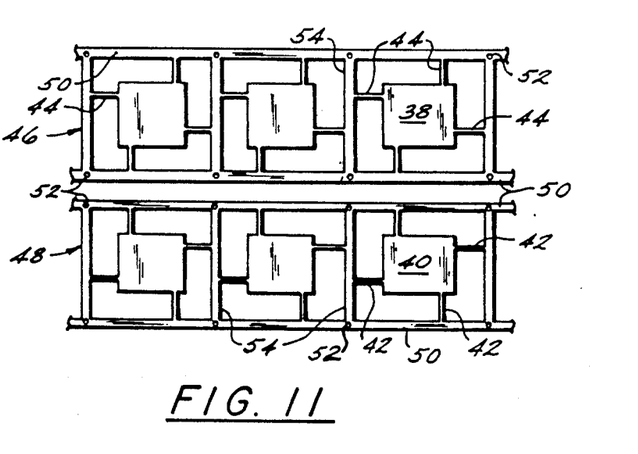
FIG. 11 is a plan view depicting two decoupling capacitor lead frames used in assembling the decoupling capacitor in accordance with the present invention.
Figure 12:
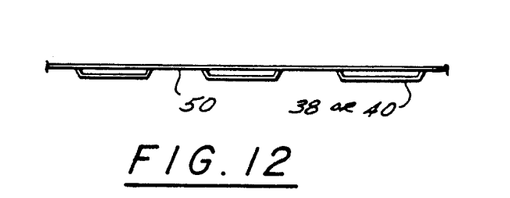
FIG. 12 is a side elevation view of one of the lead frames of FIG. 11.

Turning now to FIGS. 11-14, a preferred method of manufacturing the decoupling capacitor 34 used in the present invention is shown. Preferably, both the top and bottom conductors 38 and 40 are stamped in a strip 46 and 48 to facilitate assembly. Each strip includes a pair of carrier supports 50 having registrations holes 52 therein. Leads 42 and 44 extending from conductors 38 and 40 respectively are attached either to carrier supports 50 or lateral supports 54 extending between supports 50. As shown in FIG. 11, each conductor 38 and 40 depends downwardly thus providing for the formation of the leads 42 and 44 at the time of stamping. The pair of stamped capacitor frames 46 and 48 are superimposed over one another with a suitable high dielectric (ceramic) layer 36 (see FIG. 13) being positioned between each opposed electrode 38 and 40. The dielectric layer 36 is attached to electrodes 38 and 40 using a suitable non-conductive adhesive such as a high temperature epoxy of the type used for attaching the IC chip 28 to die support platform 22. The conductive electrodes are preferably made of copper alloy 151 or 194, Kovar, Alloy 42 or any other suitable conductive material such as nickel, tin, silver or gold plated metals. For reasons of economy, the conductors 42 and 44 may be silver or gold plated only at the portion of leads 42, 44 wherein connection is made to the lead frame fingers. The dielectric layer can be any suitable ceramic material such as Barium Titanate or other known high dielectric constant materials. Preferably, the dielectric layer has a thickness of about 0.003" to 0.005". The total thickness of the formed capacitor should be in the range of 0.010"-0.015".

Figure 13:
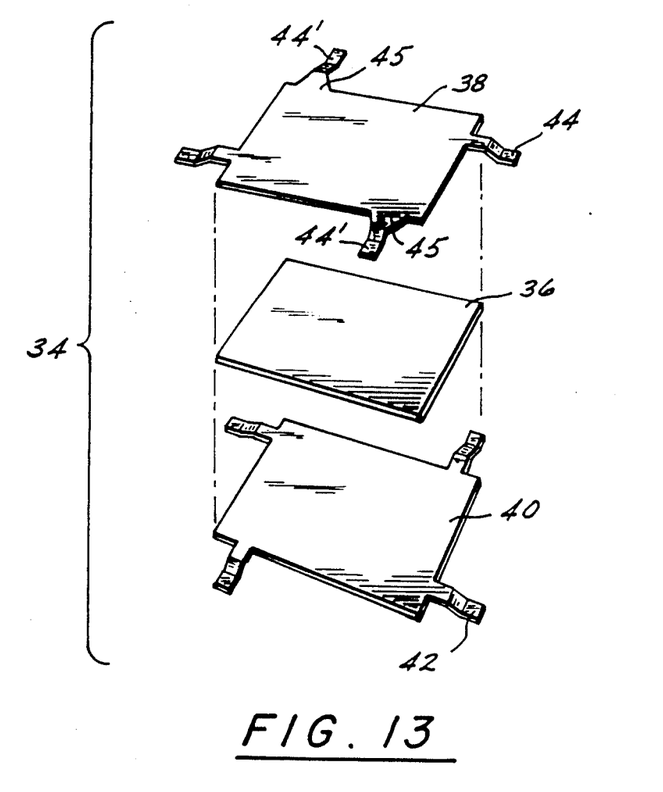
FIG. 13 is a perspective exploded view of a decoupling capacitor in accordance with the present invention.
Figure 14:
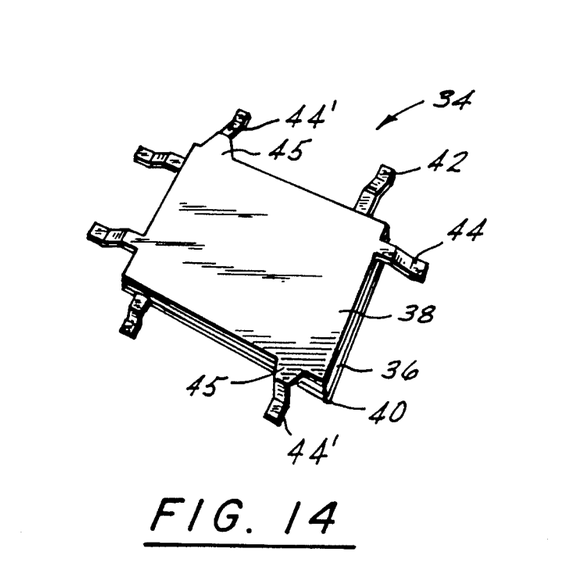
FIG. 14 is a perspective assembled view of the decoupling capacitor of FIG. 13.

As shown in FIGS. 13 and 14, the conductors 38, 40 and leads 42, 44 are singulated from the capacitor frames 46 and 48 to provide the final assembled decoupling capacitor for attachment to the lead frame 10 as described in detail above. It will be appreciated that the decoupling capacitor 34 shown in FIGS. 13 and 14 is suitable for use in the embodiment of FIGS. 7-9 wherein the IC chip is not grounded to the die support platform thereby necessitating the presence of leads 44 extending from upper electrode 38. Also as shown in FIG. 13, in a preferred embodiment, the leads 44 are widened at their base so as to decrease inductance. For illustration only, two such leads 44' have widened bases 45. Preferably, all of the leads in a given decoupling capacitor 34 will have the wide configuration shown at 44' in FIG. 13.

Figure 10:
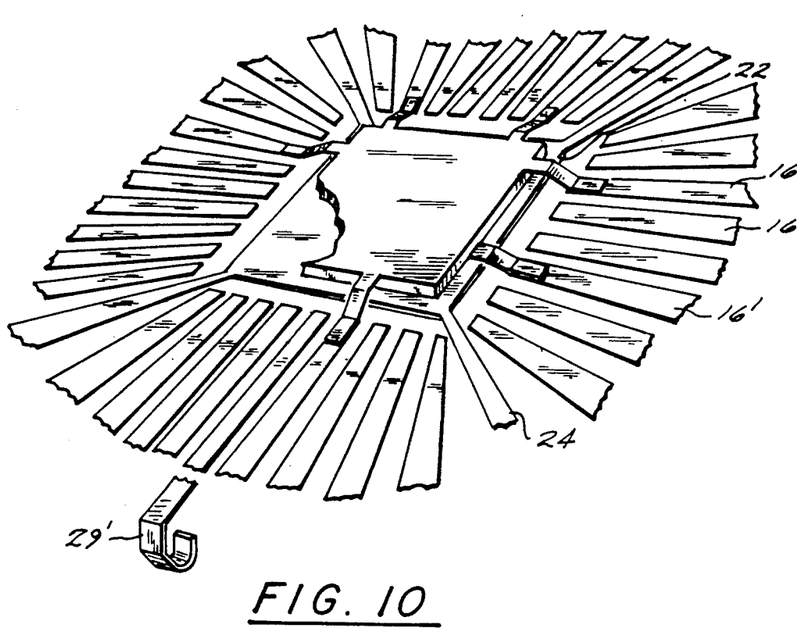
FIG. 10 is a perspective view of the assembly shown in FIG. 15 with the molding removed.
Figure 15:
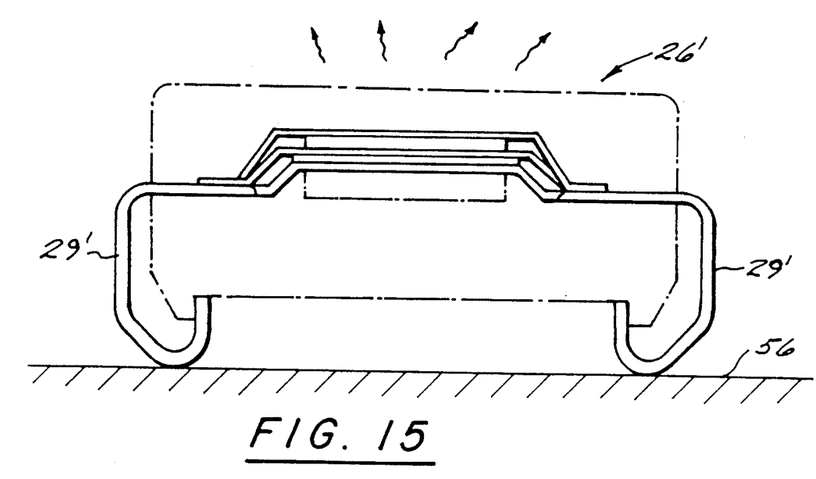
FIG. 15 is a cross sectional elevation view showing an alternative configuration of the present invention.

In the embodiments described in FIGS. 2 and 7, the lead frame is positioned such that decoupling capacitor 34 is on the bottom of the final molded package 26 resulting in increased heat dissipation through the bottom thereof and into the circuit board. In FIGS. 10 and 15, an alternative embodiment of the present invention is shown wherein the lead frame is positioned in an opposite orientation such that capacitor 34 is directed upwardly towards the top surface of the molded package 26' and away from the circuit board 56 as indicated by the arrows.

Figure 16:
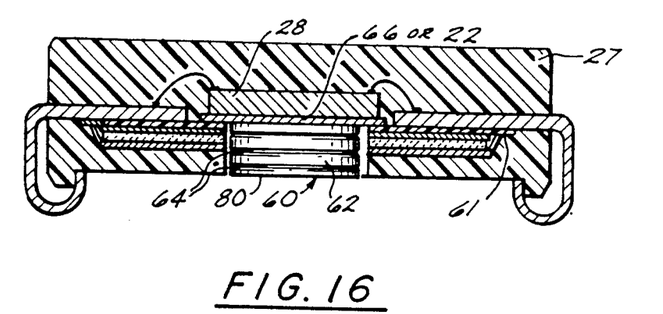
FIG. 16 is a cross sectional elevation view depicting still another embodiment of the present invention having improved thermal conductivity.
Figure 17:
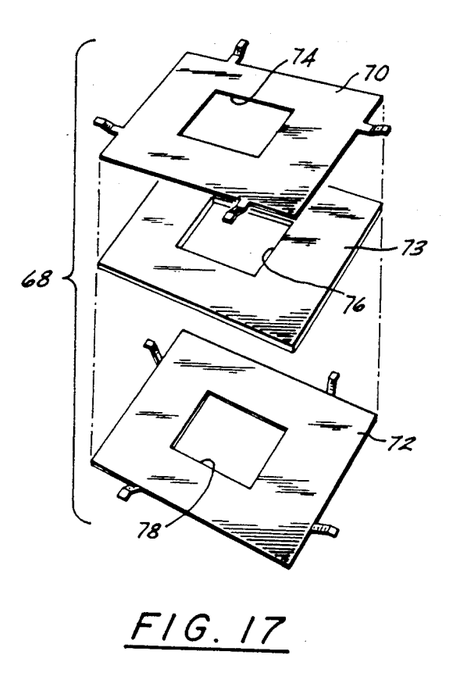
FIG. 17 is a perspective exploded view of a decoupling capacitor used in the embodiment of FIG. 16.
Figure 18A:
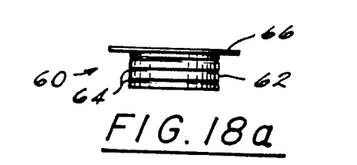
FIG. 18A is a side elevation view and 18B–C are perspective views of a heat sink used in the embodiment of FIG. 16.
Figure 18B:
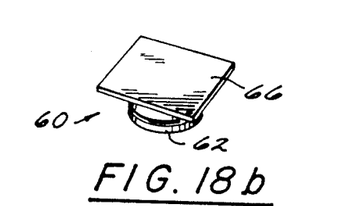
Figure 18C:
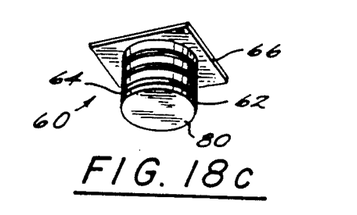

Referring now to FIGS. 16-22, a preferred embodiment of the present invention is depicted wherein heat dissipation away from the integrated circuit die is further improved by the addition of a heat sink plug. This plug is shown generally at 60 in FIG. 18 and includes a generally cylindrical stem 62 preferably having grooving or striations 64 along its outer surface and a planar flat top 66 affixed to one side of cylindrical stem 62. Referring to FIG. 16, when using the heat sink 60 embodiment, the die support platform (item 22 in lead frame 10 of FIG. 1) is initially removed from the lead frame and replaced with the flat top 66 of heat sink 60. Then, the heat sink assembly is attached to the lead frame by means of a ring of polyimide (or other suitable insulator) layer 61 coated with an appropriate adhesive such as an epoxy. Integrated circuit chip 28 is then adhesively attached to flat surface 66 using a thermally conductive adhesive. As in the several embodiments of FIGS. 2 and 7, the adhesive bonding IC chip body 28 to top 66 may be either electrically conductive or non-conductive depending upon whether IC chip body 28 is connected to ground. Alternatively, the stem 52 may be used without top 66 and directly attached to the die support platform 22. In either case, it will be appreciated that the resulting structure will be the same.

Figure 19:
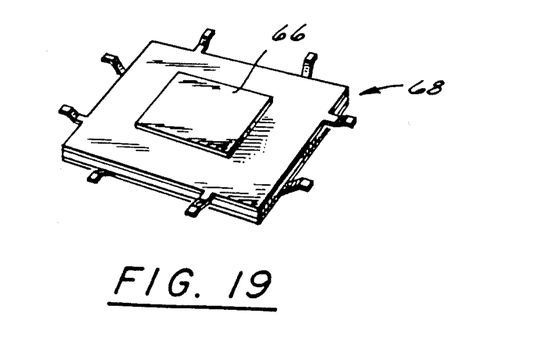
FIG. 19 is a perspective assembled view of a decoupling capacitor and heat sink used in the embodiment of FIG. 16.

Heat sink 60 extends outwardly through the center of a modified decoupling capacitor of the type described above and shown at 34 in the prior FIGURES. Thus, referring to FIGS. 7-19, this decoupling capacitor shown generally at 68 comprises similar upper and lower conductors 70, 72 and central layer of dielectric material 73 with the primary distinction being corresponding and aligned openings 74, 76 and 78, respectively, therethrough. These openings will align when the conductor 72, dielectric 74 and conductor 70 are sandwiched together. Thereafter, heat sink 60 is positioned through the aligned openings as shown in FIG. 19. The decoupling capacitor is attached to the heat sink and the lead frame by means of the adhesive coated polyimide 61 as described above. Preferably, the bottom surface 80 of stem 62 is exposed from the surrounding molding material 27 (see FIG. 16) so that heat is conducted directly between silicon chip 28 through flat support 66, stem 62 and directly out of package 27.

Figure 20A:
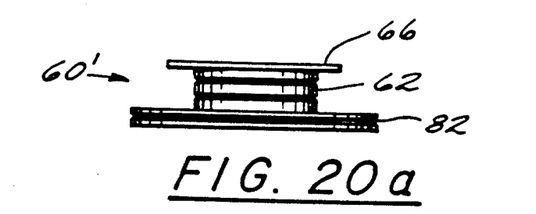
FIG. 20A is a side elevation view and FIG. 20B is a perspective view of an alternative embodiment of a heat sink for use in the present invention.
Figure 20B:
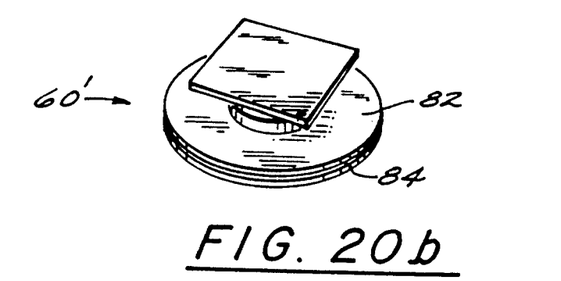
Figure 21:
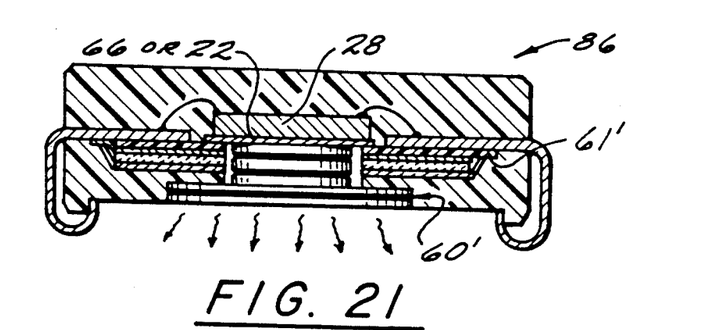
FIG. 21 is a cross sectional elevation view of the present invention incorporating the heat sink of FIG. 20.
Figure 22:
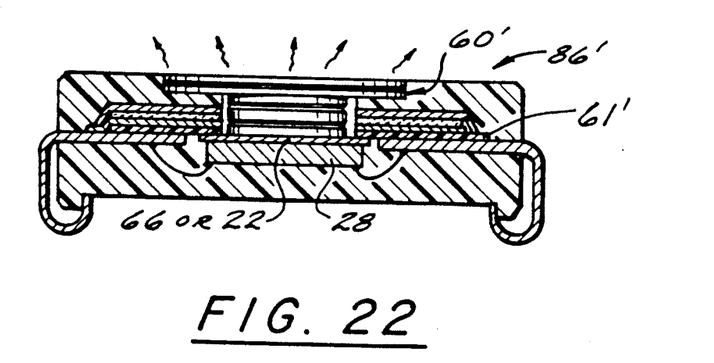
FIG. 22 is a cross sectional elevation view of an embodiment of the present invention incorporating the heat sink of FIG. 20A having an opposed orientation relative to FIG. 21.

In still another preferred embodiment shown in FIGS. 20A and 20B, the lower portion of stem 62' of a modified heat sink 60' includes a larger flattened disk 82 which is preferably provided with striations 84 therein. Referring to FIG. 21 preferred heat sink 60' is positioned within package 86 so that large flattened disk 82 is exposed along the bottom of the package so as to maximize heat transfer away from IC chip 28. Similarly in FIG. 22, the components have an opposed orientation such that heat sink 60' is directed upwardly and large disk 82 removes and dissipates heat out of the top of package 86'.

Heat sink 60 and 60' is preferably comprised of a conductive metal or other highly thermally conductive material. The several striations 64 and 84 are provided to improve the mechanical interlocking with the surrounding molding compound. While heat sink 60, 60' has been shown with stem 62 being cylindrical, it will be appreciated that stem 62 may take on any other configuration. Similarly, while the opening through the decoupling capacitor 68 in FIG. 17 have been shown as square or rectangular, these openings may also have any suitable configuration or shape.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A molded integrated circuit (IC) package comprising:
   lead frame means, said lead frame means including a plurality of conductive fingers arranged in a preselected pattern, said fingers each having a first end and a second end, said first ends of said fingers terminating at an inner space;
   an integrated circuit support platform being positioned within said space in close proximity to said first ends of said fingers, said support platform having opposed first and second surfaces;
   an integrated circuit chip on said first surface of said support platform, said integrated circuit chip being electrically connected to said first ends of said fingers;
   a capacitor attached to said second surface of said support platform, said capacitor including leads extending outwardly therefrom, said leads being electrically connected to selected fingers of said lead frame means; and
   molding material encapsulating said integrated circuit chip and capacitor and at least part of said lead frame means.

2. The IC package of claim 1 wherein said capacitor is attached to said second surface of said support platform using an adhesive.

3. The IC package of claim 2 wherein:
   said adhesive is thermally conductive.

4. The IC package of claim 2 wherein:
   said adhesive is electrically conductive.

5. The IC package of claim 2 wherein:
   said adhesive is electrically non-conductive.

6. The IC package of claim 1 wherein said capacitor comprises:
   a pair of first and second electrodes sandwiching therebetween at least one layer of dielectric material with said leads extending from at least one of said first and second electrodes.

7. The IC package of claim 6 wherein:
   said leads extend from only one of said first and second electrodes and said capacitor is attached to said support platform using a conductive adhesive.

8. The IC package of claim 6 wherein:
   said leads extend from both of said first and second electrodes and said capacitor is attached to said support platform using a non-conductive adhesive.

9. The IC package of claim 1 wherein the support platform has a selected surface area and wherein:
   said capacitor has a surface area which is greater than the surface area of said support platform.

10. The IC package of claim 1 wherein the support platform has a selected surface area and wherein:
    said capacitor has a surface area which is commensurate with the surface area of said support platform.

11. The IC package of claim 1 wherein the support platform has a selected surface area and wherein:
    said capacitor has a surface area which is less than the surface area of said support platform.

12. The IC package of claim 1 wherein:
    each of said leads from said capacitor include a base section and a tip which attaches to a finger of said lead frame means, said base section being wider than said tip to reduce inductance.

13. The IC package of claim 12 wherein said capacitor comprises:
    a pair of first and second annular electrodes sandwiching therebetween at least one annular layer of dielectric material, the annulus of each of said first and second electrodes and said layer of dielectric material being aligned and cooperating to define said opening.

14. The IC package of claim 1 wherein said capacitor includes an opening therethrough, said opening being aligned with said integrated circuit chip and including:
   heat sink plug means positioned in said opening and thermally communicating with said integrated circuit chip for transferring heat away from said circuit chip.

15. The IC package of claim 14 wherein said heat sink plug means comprises a stem attached to said support platform.

16. The IC package of claim 14 wherein:
   said stem terminates at a surface which is exterior of said molding material.

17. The IC package of claim 14 wherein:
   said stem has striations therein for improving mechanical interlocking between said stem and said molding material.

18. The IC package of claim 17 wherein:
   said flat plate has a surface area which is greater than the surface area of said support platform.

19. The IC package of claim 14 including:
   a flat plate attached to an end of said stem, said flat plate terminating at a surface which is exterior of said molding material.

20. The IC package of claim 14 including:
   a layer of electrically insulative material bonding said heat sink plug means to said conductive fingers of the lead frame means.

21. The IC package of claim 20 wherein said electrically insulative layer comprises:
   a ring of plastic film coated with an adhesive.

22. The IC package of claim 1 wherein:
   said capacitor comprises a multilayer capacitor.

* * * * *